United States Patent
Nakata

(10) Patent No.: US 9,653,412 B1
(45) Date of Patent: May 16, 2017

(54) METHOD OF MANUFACTURING SEMICONDUCTOR DEVICE

(71) Applicant: Mitsubishi Electric Corporation, Tokyo (JP)

(72) Inventor: Kazunari Nakata, Tokyo (JP)

(73) Assignee: Mitsubishi Electric Corporation, Tokyo (JP)

(*) Notice: Subject to any disclaimer, the term of this patent is extended or adjusted under 35 U.S.C. 154(b) by 0 days.

(21) Appl. No.: 15/203,926

(22) Filed: Jul. 7, 2016

(30) Foreign Application Priority Data

Dec. 15, 2015 (JP) .................. 2015-243779

(51) Int. Cl.
*H01L 21/00* (2006.01)
*H01L 23/00* (2006.01)
*H01L 21/78* (2006.01)
*H01L 21/683* (2006.01)
*H01L 29/739* (2006.01)
*H01L 29/66* (2006.01)
*H01L 21/265* (2006.01)
*H01L 21/324* (2006.01)

(52) U.S. Cl.
CPC .......... *H01L 23/562* (2013.01); *H01L 21/265* (2013.01); *H01L 21/324* (2013.01); *H01L 21/6836* (2013.01); *H01L 21/78* (2013.01); *H01L 29/66348* (2013.01); *H01L 29/7397* (2013.01); *H01L 2221/68327* (2013.01)

(58) Field of Classification Search
CPC ... H01L 23/562; H01L 21/265; H01L 21/324; H01L 21/6836
See application file for complete search history.

(56) References Cited

U.S. PATENT DOCUMENTS

| 7,348,275 | B2 | 3/2008 | Sekiya | |
|---|---|---|---|---|
| 2007/0123002 | A1* | 5/2007 | Norimoto | ......... H01L 21/67092 438/464 |
| 2008/0064187 | A1* | 3/2008 | Brown | ................... B23K 26/03 438/464 |

FOREIGN PATENT DOCUMENTS

| JP | 2005-317570 A | 11/2005 |
|---|---|---|
| JP | 2006-196710 A | 7/2006 |
| JP | 2007-019379 A | 1/2007 |

* cited by examiner

*Primary Examiner* — Bradley K Smith
(74) *Attorney, Agent, or Firm* — Studebaker & Brackett PC

(57) ABSTRACT

On a first wafer surface of a semiconductor wafer, a projection-depression shape is formed. On the first wafer surface, a resin member is so formed to have a resin outer peripheral end positioned away from a wafer outer peripheral end and expose the wafer outer peripheral end. By partially removing the semiconductor wafer, on a second wafer surface of the semiconductor wafer, formed is a recessed shape having a recessed-portion outer peripheral end positioned 0.5 mm or more inside from the resin outer peripheral end. After performing a processing on the second wafer surface, the resin member is removed.

8 Claims, 10 Drawing Sheets

F I G . 1
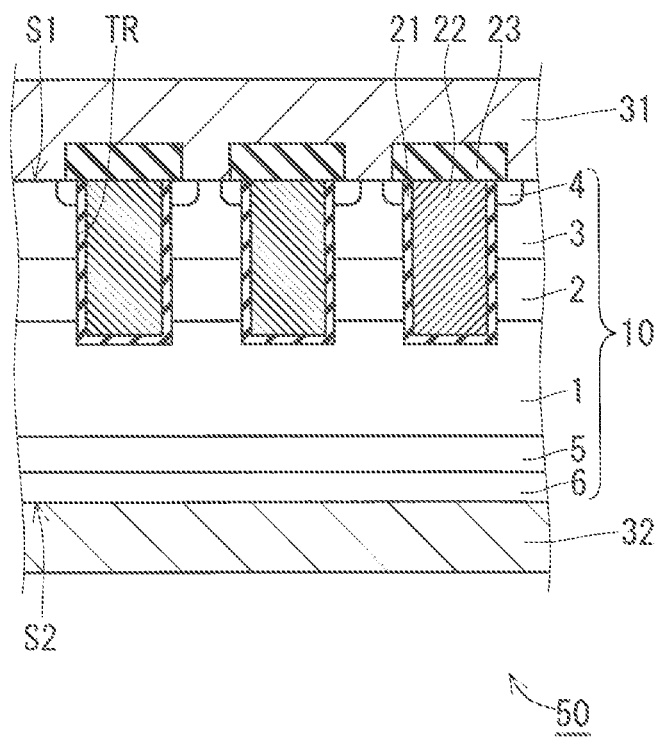

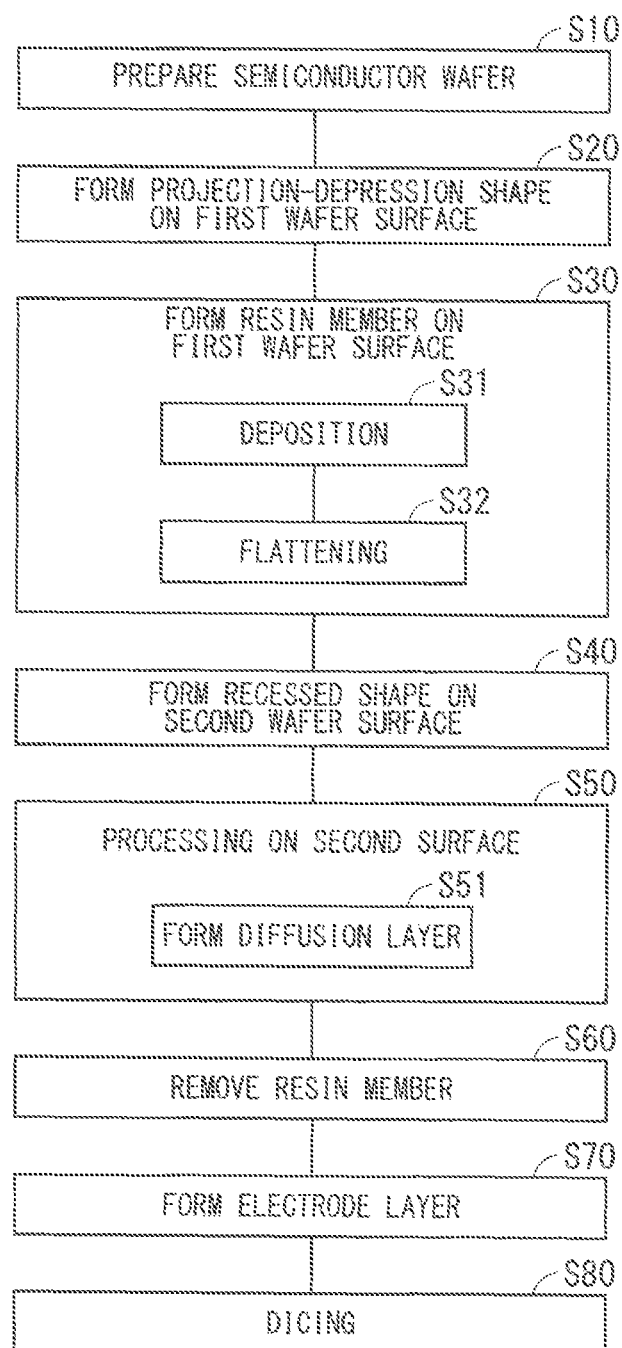

F I G. 5
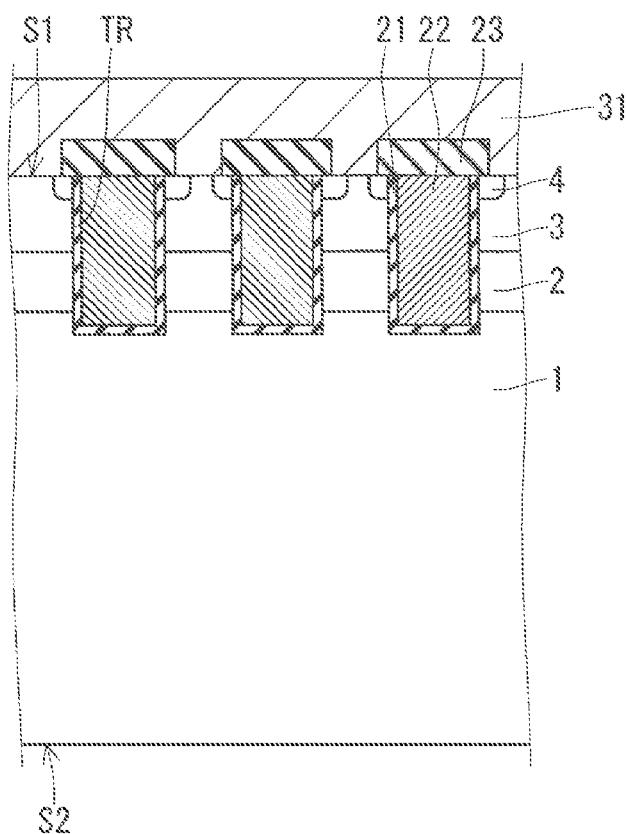
F I G. 6
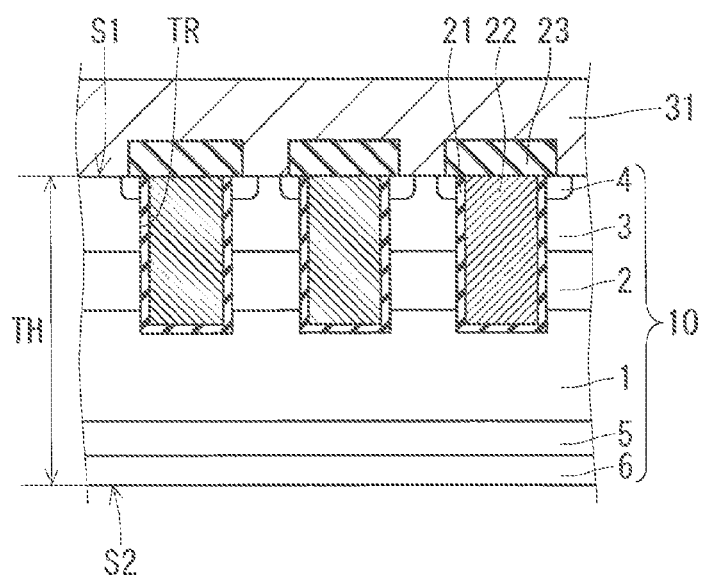

F I G. 7A
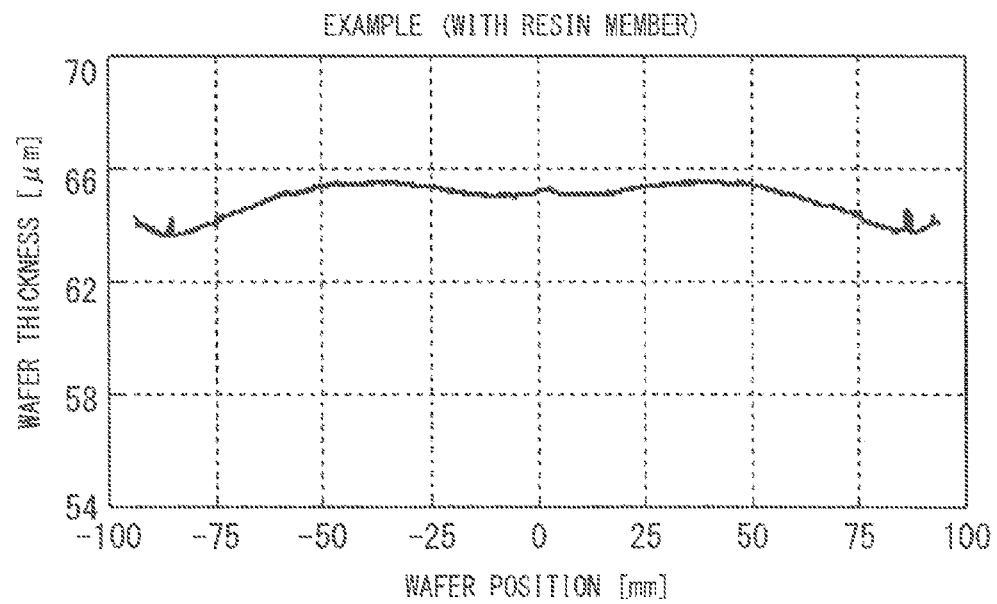
F I G. 7B
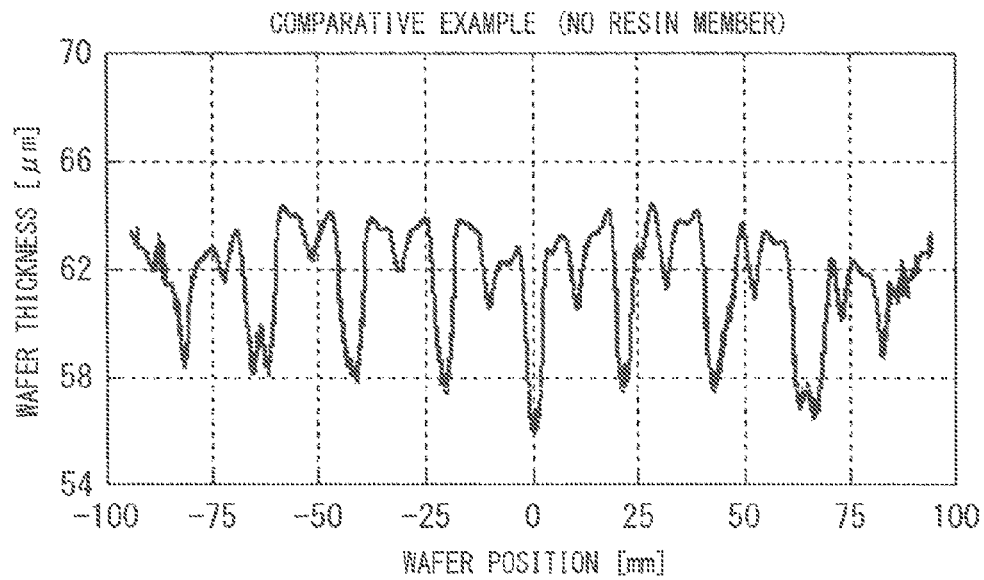

METHOD OF MANUFACTURING SEMICONDUCTOR DEVICE

BACKGROUND OF THE INVENTION

Field of the Invention

The present invention relates to a method of manufacturing a semiconductor device, and more particularly to a method of manufacturing a vertical power semiconductor device.

Description of the Background Art

In the manufacture of a semiconductor device, recently, the importance of a processing for reducing the thickness of a semiconductor wafer (hereinafter, also referred to as a "thinning processing") has increased. In the field of LSI, the thinning processing is useful for high densification of a package by three-dimensional packaging technology or the like, and the wafer thickness at the completion of the process is sometimes reduced to, e.g., about 25 µm. Further, in the field of vertical power semiconductor device, the thinning processing is useful for improving the energization performance, typically such as On-state characteristics, since a current path in a semiconductor device can be shortened by thinning a wafer. In order to reduce cost and improve properties, recently, an ultra-thin wafer process using a wafer thinned to a thickness of about 50 µm, which is formed by an FZ (Floating Zone) method, is sometimes performed.

Among the typical vertical power semiconductor devices are, for example, a diode element and a semiconductor switching element. The semiconductor switching element is typically an IGBT (Insulated Gate Bipolar Transistor) or a MOSFET (Metal Oxide Semiconductor Field Effect Transistor). These elements are widely applied to inverter circuits such as industrial motors, automobile motors, and the like, power supply devices for mass-storage servers, uninterruptible power supplies, and the like.

As the thinning processing, generally performed are mechanical polishing on a wafer back surface by backgrinding or polishing and wet or dry etching for removing processing distortion caused by the mechanical polishing. After that, on the back surface of the wafer, a diffusion layer is formed by ion implantation or heat treatment. Then, an electrode is further formed on the back surface by evaporation or sputtering. After that, dicing of the wafer is performed. Specifically, after mounting the wafer on a dicing sheet, a plurality of chips are cut out from the wafer by using a dicing blade or the like.

In order to prevent breakage of the semiconductor wafer during the thinning processing and after that, a protection tape can be provided on a wafer upper surface. The protection tape not only reinforces the strength of the wafer which is thinned by the thinning processing but also reduces the effect of surface level difference on the wafer upper surface. The surface level difference is formed on an upper surface of the semiconductor wafer in accordance with device structure (a trench gate, an electrode, and the like) in the process of manufacturing the semiconductor device. As the protection tape, for example, a well-known one is formed mainly of polyethylene terephthalate (PET). In the recent thin-type device, however, the ratio of surface level difference to total thickness of a device has become larger, and as a result, it has become difficult to sufficiently absorb the surface level difference by the protection tape. When absorption of the level difference is insufficient, the semiconductor wafer is apt to break, and in particular, breakage of the wafer is apt to occur during grinding.

Then, according to Japanese Patent Application Laid Open Gazette No. 2005-317570, a surface protection tape for backgrinding which is attached to a wafer surface is deformed by heating. The unevenness (projections and depressions) of a polyimide protection film on the wafer surface is reduced.

Further, according to Japanese Patent Application Laid Open Gazette No. 2006-196710, onto a surface of a semiconductor wafer which has projections and depressions, attached is a tape which has an adhesive layer having a thickness larger than the level difference of the projections and depressions and has a base material layer. The adhesive layer has an adhesive agent layer formed of an adhesive agent and a softening material layer formed of a resin material whose viscosity is reduced by heating, which is softer than a component material of the above base material layer. By heating the tape, the viscosity of the softening material layer is reduced. Since the softening material layer is thereby deformed, a surface of the base material layer is almost flattened. After that, by grinding the back surface of the semiconductor wafer while the tape is being attached, the wafer is thinned. According to the description of the Japanese Patent Application Laid Open Gazette No. 2006-196710, with deformation of the softening material layer, the level difference of the projections and depressions on the tape surface becomes about 10% of that on the wafer surface. In other words, with the tape, the level difference of the projections and depressions on the wafer surface is reduced.

The semiconductor wafer after being subjected to the thinning processing is apt to have a warpage. This warpage can be corrected by the protection tape only in a small degree. This is because the protection tape only has relatively low rigidity since the protection tape needs to be easily deformed to some degree for convenience of handling. A wafer having a large warpage has a difficulty in being conveyed and is apt to be broken or chipped in handling. Therefore, the technique using the protection tape is effective for absorption of the surface level difference but not very effective for reduction of the warpage. For this reason, in the prior-art technique using the protection tape, it is sometimes impossible to sufficiently solve the difficulty of handling a wafer after the thinning processing.

As a method of ensuring the rigidity of a semiconductor wafer after the thinning processing in order to reduce its warpage, one possible method is to thin only part of the semiconductor wafer, not the whole thereof. According to Japanese Patent Application Laid Open Gazette No. 2007-19379, for example, a recess is formed by grinding a region corresponding to a device region on a back surface of a wafer, and a ring-shaped reinforcing portion is formed on the outer periphery side of the recess. Unless the ring-shaped reinforcing portion is removed, the outer periphery side of the device region is reinforced by the ring-shaped reinforcing portion. For this reason, handling of the wafer after grinding of the back surface, such as conveyance of the wafer, additional processing on the wafer, or the like, becomes easier.

The technique of providing a resin member such as a protection tape on an upper surface of a semiconductor wafer is effective for preventing breakage of the wafer by absorbing surface level difference on the upper surface. As mentioned above, however, this technique is not very effective for reducing warpage of the wafer. On the other hand, the technique using a reinforcing portion formed by leaving an outer peripheral portion of a wafer thickly is effective for facilitating the handling of the wafer since the warpage of the wafer is reduced by ensuring the rigidity of the wafer. This technique, however, has no effect of absorbing the surface level difference. Therefore, only with this technique, the breakage of the wafer due to the surface level difference is apt to occur.

SUMMARY OF THE INVENTION

Then, the present inventor considered combining the above-described two types of techniques, to thereby facilitate the handling of a semiconductor wafer during the thinning processing and after the process. As a result of earnest consideration, it is found that these techniques do not act independently of each other but have effects on each other. Specifically, the present inventor found that it is sometimes impossible to effectively prevent the breakage of the semiconductor wafer during the thinning processing by simply combining these techniques, and in order to effectively prevent the breakage, it is necessary to cause a relative position of the resin member and the reinforcing portion which are described above to satisfy a specific condition.

The present invention is made on the basis of the above findings, and it is an object of the present invention to provide a method of manufacturing a semiconductor device, which can prevent breakage of a semiconductor wafer during the thinning processing and also facilitate handling of the semiconductor wafer after the thinning processing.

The present invention is intended for a method of manufacturing a semiconductor device. According to an aspect of the present invention, the method includes the following steps. A semiconductor wafer having a first wafer surface, a second wafer surface opposite to the first wafer surface, and a wafer outer peripheral end is prepared. A projection-depression shape is formed on the first wafer surface of the semiconductor wafer. After forming the projection-depression shape, a resin member which has a resin outer peripheral end away from the wafer outer peripheral end and exposes the wafer outer peripheral end is formed on the first wafer surface of the semiconductor wafer. By partially removing the semiconductor wafer, a recessed shape which has a recessed-portion outer peripheral end positioned 0.5 mm or more inside from the resin outer peripheral end is formed on the second wafer surface of the semiconductor wafer. After forming the recessed shape, a processing on the second wafer surface of the semiconductor wafer is performed. After performing the processing, the resin member is removed.

According to the present invention, by partially removing the semiconductor wafer, the recessed shape is formed on the second wafer surface of the semiconductor wafer. In the semiconductor wafer, the portion outer than the recessed shape has a function as a reinforcing portion of the semiconductor wafer. Since the rigidity of the semiconductor wafer is thereby ensured, the warpage of the wafer is reduced. Therefore, it becomes possible to facilitate the handling of the semiconductor wafer after the thinning processing. In this case, the recessed shape is so formed as to have the recessed-portion outer peripheral end positioned 0.5 mm or more inside from the resin outer peripheral end. It is thereby possible to prevent breakage of the semiconductor wafer during the thinning processing. Thus, according to the present invention, it is possible to prevent breakage of the semiconductor wafer during the thinning processing and also facilitate handling of the semiconductor wafer after the thinning processing.

These and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a partial cross section schematically showing a structure of a semiconductor device in accordance with a first preferred embodiment of the present invention;

FIG. 2 is a flowchart schematically showing a flow of a method of manufacturing the semiconductor device in accordance with the first preferred embodiment of the present invention;

FIG. 5 is a partial cross section schematically showing a semiconductor wafer on which a projection-depression shape is formed in the method of manufacturing the semiconductor device in accordance with the first preferred embodiment of the present invention;

FIG. 6 is a partial cross section schematically showing the semiconductor wafer on which a diffusion layer is formed in the method of manufacturing the semiconductor device in accordance with the first preferred embodiment of the present invention;

FIG. 7A is a graph showing an exemplary thickness distribution of the semiconductor wafer after a thinning processing in the method of manufacturing the semiconductor device in accordance with the first preferred embodiment of the present invention, and FIG. 7B is a graph showing an exemplary thickness distribution of the semiconductor wafer after the thinning processing in a manufacturing method of Comparative Example;

DESCRIPTION OF THE PREFERRED EMBODIMENTS

Figure 3A:
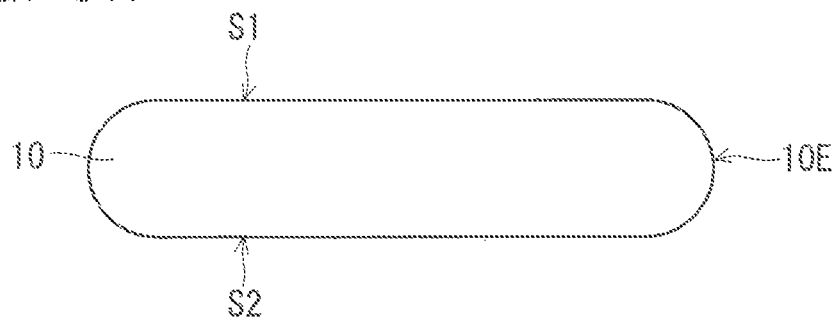
FIGS. 3A to 3D are cross sections schematically showing process steps in the method of manufacturing the semiconductor device in accordance with the first preferred embodiment of the present invention.
Figure 3B:
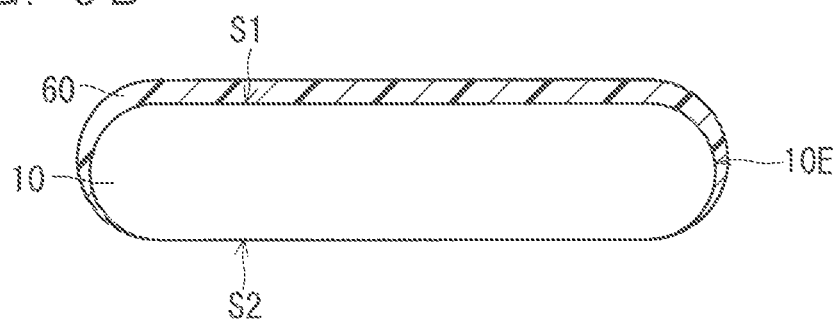
Figure 3C:
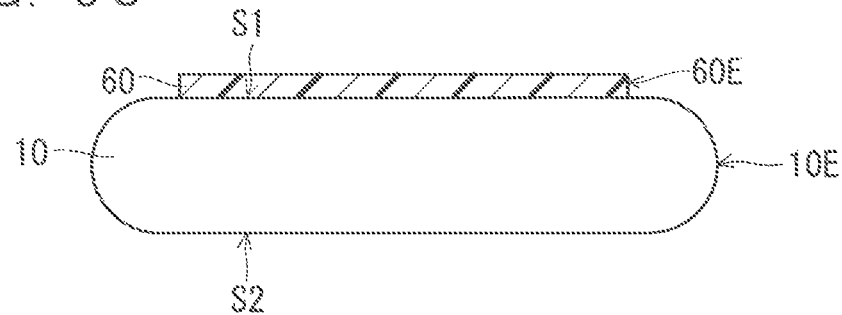

Hereinafter, with reference to figures, the preferred embodiments of the present invention will be discussed. In the following figures, the same or corresponding constituent elements are represented by the same reference signs.

The First Preferred Embodiment (Constitution of Device)

With reference to FIG. 1, a semiconductor device 50 of the present preferred embodiment is a vertical power semiconductor device, and specifically, a trench gate type IGBT. The semiconductor device 50 has a semiconductor wafer 10, a gate insulating film 21, a gate electrode 22, an interlayer insulating film 23, an emitter electrode 31 (a first electrode layer), and a collector electrode 32 (a second electrode layer). The semiconductor wafer 10 has a wafer upper surface S1 (a first wafer surface) and a wafer back surface S2 (a second wafer surface opposite to the first wafer surface). On the wafer upper surface S1, a projection-depression shape (uneven shape) is formed due to the existence of a trench TR, the interlayer insulating film 23, the emitter electrode 31, an electrode pad (not shown), and the like.

The semiconductor wafer 10 has an n-type drift layer 1, an n-type layer 2, a p-type base layer 3, an n-type emitter layer 4, an n-type layer 5, and a p-type collector layer 6. In the present preferred embodiment, the semiconductor wafer 10 is formed of a silicon. The p-type collector layer 6 forms the wafer back surface S2. The n-type layer 5 is formed on the p-type collector layer 6. The n-type drift layer 1 is formed on the n-type layer 5. The n-type layer 2 is formed on the n-type drift layer 1. The p-type base layer 3 is formed on the n-type layer 2. The n-type emitter layer 4 is partially formed on the p-type base layer 3. The n-type emitter layer 4 and the p-type base layer 3 form the wafer upper surface S1.

The trench TR provided in the wafer upper surface S1 goes through the n-type emitter layer 4, the p-type base layer 3, and the n-type layer 2 and reaches the n-type drift layer 1. The gate insulating film 21 covers an inner wall of the trench TR. The gate electrode 22 is provided in the trench TR with the gate insulating film 21 interposed therebetween. The emitter electrode 31 is formed on the wafer upper surface S1 and is in contact with the n-type emitter layer 4 and the p-type base layer 3. The collector electrode 32 is formed on the wafer back surface S2 and is in contact with the p-type collector layer 6.

(Manufacturing Method)

FIG. 2 is a flowchart schematically showing a flow of a method of manufacturing the semiconductor device in accordance with the first preferred embodiment. FIGS. 3A to 3D are views showing the manufacturing method in the order of steps with attention paid to schematic shapes including the whole of the semiconductor wafer 10. FIGS. 4A to 4C are views showing the manufacturing method in the order of steps, with schematic illustration of respective projection-depression shapes on the wafer upper surface S1. Hereinafter, with reference to these figures, the method of manufacturing the semiconductor device in accordance with the first preferred embodiment will be described.

In Step S10 (FIG. 2), the semiconductor wafer 10 (FIG. 3A) is prepared. The semiconductor wafer 10 has the wafer upper surface S1 (the first wafer surface), the wafer back surface S2 (the second wafer surface opposite to the first wafer surface), and a wafer outer peripheral end 10E.

In Step S20 (FIG. 2), a projection-depression shape UD (FIG. 4A) is formed on the wafer upper surface S1. The projection-depression shape UD schematically shows a projection-depression shape on the wafer upper surface S1, which is due to the existence of a device structure of the semiconductor device. Specifically, with reference to FIG. 5, the projection-depression shape UD is formed due to the existence of the trench TR, the interlayer insulating film 23, the emitter electrode 31, the electrode pad (not shown), and the like.

Next, in Step S30 (FIG. 2), a resin member is formed on the wafer upper surface S1 of the semiconductor wafer 10. The resin member is formed of, for example, a polyimide resin. Specifically, first in Step S31 (FIG. 2), a resin member 60 is deposited on the wafer upper surface S1 (see FIGS. 3B and 4B). By deposition of the resin member 60 or the subsequent processing, the resin member 60 is so arranged as to have a resin outer peripheral end 60E away from the wafer outer peripheral end 10E and expose the wafer outer peripheral end 10E (see FIG. 3C). Preferably, the resin outer peripheral end 60E is arranged at a position of 0.5 mm or more inside from the wafer outer peripheral end 10E in a plan view (plan layout). This means that with respect to the position in a transverse direction of FIG. 3C, the resin outer peripheral end 60E is positioned with a spacing of 0.5 mm or more away inside (i.e., toward the center of the wafer) from the wafer outer peripheral end 10E. In a case where the deposition of the resin member 60 is performed by coating, the above-described arrangement can be easily achieved by removing an end portion of the resin member 60 in a rinse process using a spin coater. Further, in the case where the resin member 60 is formed by deposition of its material, like in the above-described coating method, the resin member does not need to have any adhesive agent, unlike in a case where a resin member which is formed in advance is attached onto the semiconductor wafer 10.

Next, in Step S32 (FIG. 2), the resin member 60 is flattened (see FIGS. 4B and 4C). Preferably, flattening can be performed by the heat treatment of the resin member 60. The heat treatment is performed, for example, at about 200° C. for about 3 minutes. The heat treatment is performed, for example, by heating the wafer back surface S2 with a heater such as a hot plate or the like, or by heating the semiconductor wafer 10 with a baking furnace. Instead of the heat treatment, a mechanical treatment may be performed. For example, cutting using a diamond bit or the like may be performed.

Figure 3D:
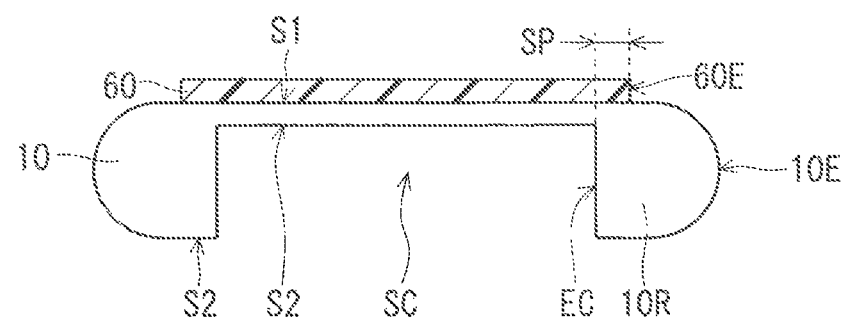
Figure 4A:
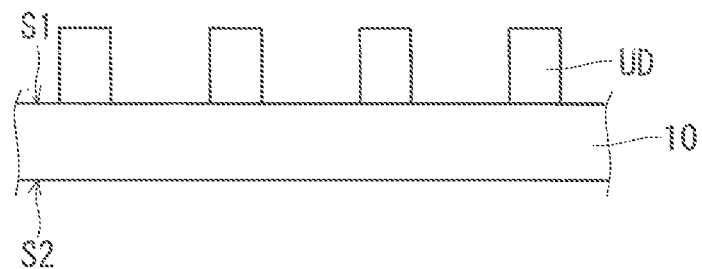
FIGS. 4A to 4C are partial cross sections schematically showing a process of forming a resin member in the method of manufacturing the semiconductor device in accordance with the first preferred embodiment of the present invention.
Figure 4B:
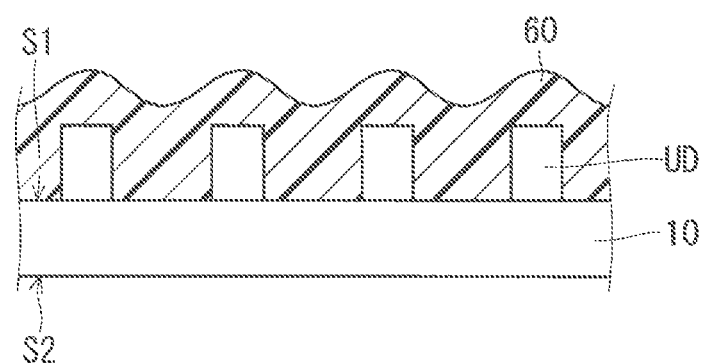
Figure 4C:
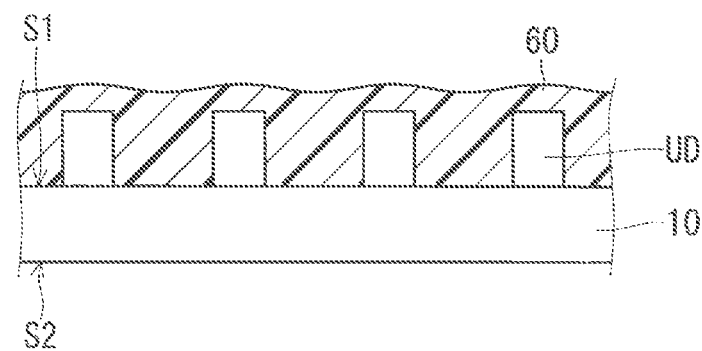

In Step S40 (FIG. 2), as shown in FIG. 3D, by partially removing the semiconductor wafer 10, a recessed shape SC is formed in the wafer back surface S2. The formation of the recessed shape SC can be performed by machining such as grinding or the like. Preferably, for removing a fractured layer caused by machining, wet etching is further performed. The wet etching can be performed by using, for example, a mixed acid containing hydrofluoric acid and nitric acid as an etchant. The recessed shape SC has a recessed-portion outer peripheral end EC positioned 0.5 mm or more inside from the resin outer peripheral end 60E in a plan view. This means that with respect to the position in a transverse direction of FIG. 3D, the recessed-portion outer peripheral end EC is positioned with a spacing SP of 0.5 mm or more away inside (i.e., toward the center of the wafer) from the resin outer peripheral end 60E. A portion of the semiconductor wafer 10, which is positioned outer than the recessed shape SC, forms an annular reinforcing portion 10R. The annular reinforcing portion 10R has a thickness larger than that of the portion of the semiconductor wafer 10 in which the recessed shape SC is formed. Further, the annular reinforcing portion 10R has an annular shape surrounding the recessed shape SC in a plan view. The annular reinforcing portion 10R thereby has a function of increasing the rigidity of the semiconductor wafer 10 after being subjected to the thinning processing.

Next, in Step S50 (FIG. 2), a processing for achieving a semiconductor device structure is performed on the wafer back surface S2. In the present preferred embodiment, as this processing, the n-type layer 5 and the p-type collector layer 6 (FIG. 6) are formed as a diffusion layer on the wafer back surface S2. The formation of the diffusion layer is performed typically by ion implantation and activation. The activation can be performed by using an electric furnace or laser.

Next, in Step S60 (FIG. 2), the resin member 60 is removed. The removal of the resin member 60 is performed, for example, by dissolving the resin with dropping of an organic solvent. Alternatively, carbonization (a so-called ashing process) of the resin by using plasma containing oxygen may be performed. Still alternatively, the removal may be performed by using a mixed solution of sulfuric acid and oxygenated water, and in this case, the above-described ashing process may be also performed.

Next, in Step S70 (FIG. 2), the collector electrode 32 is formed as an electrode layer on the wafer back surface S2. By evaporation or sputtering, for example, a metal film formed of aluminum, titanium, nickel, gold, or the like is formed on the wafer back surface S2. Preferably, after the formation of the metal film, interdiffusion of metal atoms (e.g., aluminum atoms) in the metal film and silicon atoms in the semiconductor wafer 10 is caused by a heat treatment at about 300 to 450° C. With alloying which is thereby caused, the collector electrode 32 and the semiconductor wafer 10 are adhered to each other more reliably. The above-described interdiffusion can be caused by a heat effect in soldering when the semiconductor device 50 which is cut out by dicing as described later is mounted. By using this effect, the above-described heat treatment may be omitted.

In Step S80 (FIG. 2), dicing of the semiconductor wafer 10 is performed. Specifically, first, the collector electrode 32 is attached onto an adhesive face of a dicing tape. The semiconductor wafer 10 is thereby mounted on a dicing frame. Next, by a dicing apparatus using a dicing blade or laser, a plurality of chips are cut out as the semiconductor devices 50 (FIG. 1) from the semiconductor wafer 10 on which the device structure is formed.

(Example)

FIG. 7A shows an exemplary distribution of the thickness TH (FIG. 6) of a semiconductor region of the semiconductor wafer 10 after Step S60 (FIG. 2). In the graph, "wafer position" indicates the distance from a center position of the semiconductor wafer 10 in a diameter direction. The thickness TH is the size of the semiconductor region in disregard of the existence of the trench TR as shown in FIG. 6. Thickness measurement was performed on a portion of the semiconductor wafer 10 which is subjected to the thinning processing, i.e., the recessed shape SC. For this measurement, used was a non-contact measurement apparatus using infrared light ("Optical MicroGauge" made by Hamamatsu Photonics).

In obtaining a sample for the above-described thickness measurement, as Step S10 (FIG. 2), a semiconductor wafer 10 having a diameter of 200 mm (FIG. 3A) was prepared. As Step S20 (FIG. 2), a projection-depression shape UD having a surface level difference of 10 μm (FIG. 4A) was formed. As Step S30 (FIG. 2), a resin member 60 was formed by a coating process with a thickness of 20 μm (FIG. 4B) and a flattening process (FIG. 4C) by performing the heat treatment at 200° C. for 3 minutes. As Step S40 (FIG. 2), a thinning processing (FIG. 3D) was performed by grinding up to 85 μm with an infield grinder device and then wet etching up to 65 μm using a mixed acid consisting of hydrofluoric acid, nitric acid, sulfuric acid, and phosphoric acid. The width (the size in the transverse direction of FIG. 3D) of the annular reinforcing portion 10R was about 3 mm.

On the other hand, FIG. 7B shows a result of the Comparative Example in which the above-described formation of the resin member 60 is not performed. From the comparison between FIGS. 7A and 7B, it can be seen that by formation of the resin member 60, the thickness distribution of the semiconductor wafer 10 after the thinning processing is made more uniform.

Figure 8A:
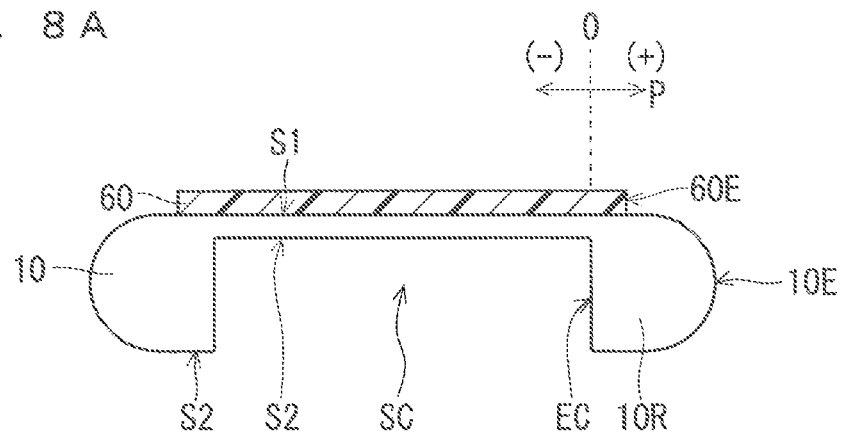
FIG. 8A is a cross section schematically showing a definition of a relative position of the resin member and an annular reinforcing portion after the thinning processing.
Figure 8B:
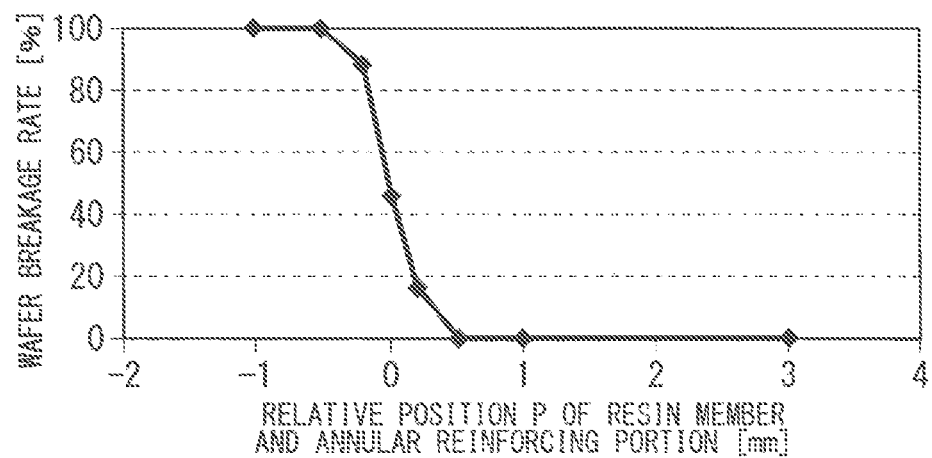
FIG. 8B is a graph showing an exemplary relation between this relative position and a wafer breakage rate.

FIG. 8A is a cross section schematically showing a definition of a relative position P of the resin member 60 and the annular reinforcing portion 10R after the thinning processing. The relative position P is a position of the resin outer peripheral end 60E relative to the position of the recessed-portion outer peripheral end EC which is a boundary between the recessed shape SC of the semiconductor wafer 10 and the annular reinforcing portion 10R thereof. It is defined that the sign of the relative position P is positive when the resin outer peripheral end 60E is positioned outer than the reference position (in other words, positioned on the annular reinforcing portion 10R) and is negative when the resin outer peripheral end 60E is positioned inner than the reference position (in other words, positioned on the recessed shape SC). FIG. 8B is a graph showing an exemplary relation between the relative position P which is defined as above and the wafer breakage rate in the case where the thinning processing is performed up to 50 μm. From this result, it can be seen that the wafer breakage rate in the thinning processing can be reduced when the relative position P is not smaller than 0. It can be seen that, in particular when the relative position P is +0.5 mm or more, in other words, when the resin member 60 is projected toward the annular reinforcing portion 10R by 0.5 mm or more, the wafer breakage rate in the thinning processing can be reduced significantly and stably. The condition that the relative position P is +0.5 mm or more means that the recessed-portion outer peripheral end EC is positioned with a spacing SP of 0.5 mm or more away inside from the resin outer peripheral end 60E in FIG. 3D.

Figure 9A:
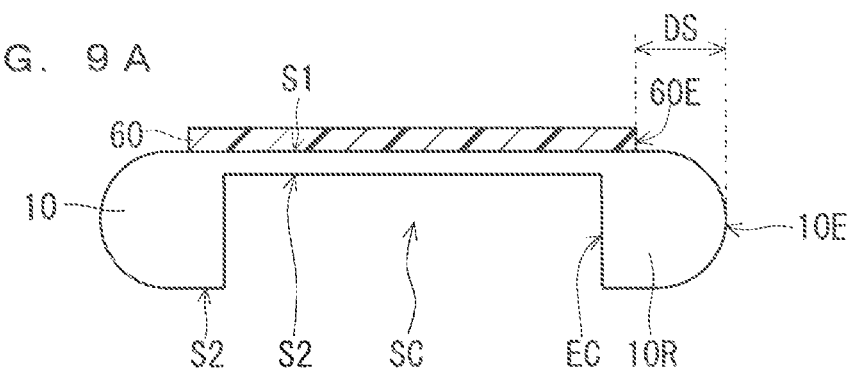
FIG. 9A is a cross section schematically showing a definition of a distance between the resin member and a wafer outer peripheral end after the thinning processing.
Figure 9B:
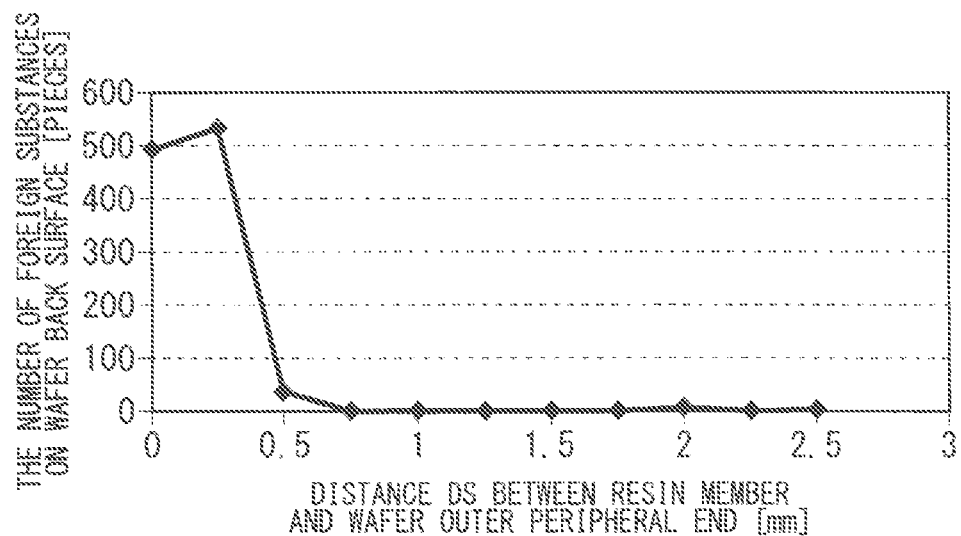
FIG. 9B is a graph showing an exemplary relation between this distance and the number of foreign substances on a wafer back surface after formation of the diffusion layer.

FIG. 9A is a cross section schematically showing a definition of a distance DS between the resin member 60 and the wafer outer peripheral end 10E after the thinning processing. The distance DS is a distance between the wafer outer peripheral end 10E and the resin outer peripheral end 60E. FIG. 9B is a graph showing an exemplary relation between this distance DS and the number of foreign substances each having a size of 5 μm or more on the wafer back surface S2 in the recessed shape SC after Step S50 (FIG. 2). From this result, it can be seen that the number of foreign substances on the wafer back surface S2 can be significantly reduced when the distance DS is 0.5 mm or more, and can be more significantly reduced when the distance DS is 0.75 mm or more. With reduction in the number of foreign substances, it is possible to prevent the foreign substances from blocking the ion implantation onto the wafer back surface S2 for forming the diffusion layer. Therefore, a high-quality diffusion layer can be formed on the wafer back surface S2.

(Summary of Effects)

According to the first preferred embodiment, by partially removing the semiconductor wafer 10, the recessed shape SC (FIG. 8A) is formed on the wafer back surface S2. The portion of the semiconductor wafer 10, which is positioned outer than the recessed shape SC, forms the annular reinforcing portion 10R. The annular reinforcing portion 10R has a function as the reinforcing portion of the semiconductor wafer 10. Since the rigidity of the semiconductor wafer 10 is thereby ensured, the warpage of the wafer is reduced. Therefore, it becomes possible to facilitate the handling of the semiconductor wafer 10 after the thinning processing. In this case, the recessed shape SC is so formed as to have the recessed-portion outer peripheral end EC positioned 0.5 mm or more inside from the resin outer peripheral end 60E in a plan view. It is thereby possible to prevent breakage of the semiconductor wafer 10 during the thinning processing (FIG. 8B). Thus, according to the present preferred embodiment, it is possible to prevent breakage of the semiconductor wafer 10 during the thinning processing and also facilitate handling of the semiconductor wafer 10 after the thinning processing.

Since the resin member 60 is deposited and then flattened (FIGS. 4B and 4C), it is possible to sufficiently ensure the flatness of the resin member 60. It thereby becomes possible to sufficiently absorb the surface level difference of the semiconductor wafer 10.

As a processing before removing the resin member 60, the n-type layer 5 and the p-type collector layer 6 (FIG. 6) are formed as the diffusion layer on the wafer back surface S2. It is thereby possible to protect the wafer upper surface S1 by the resin member 60 (FIG. 3D) in the formation of the diffusion layer on the wafer back surface S2. Specifically, it is possible to prevent the foreign substances from being attached onto the wafer upper surface S1 and prevent the wafer upper surface S1 from being damaged.

The resin outer peripheral end 60E (FIG. 9A) is positioned away from the wafer outer peripheral end 10E. Preferably, the resin outer peripheral end 60E is arranged at a position of 0.5 mm or more inside from the wafer outer peripheral end 10E in a plan view (see FIG. 9B). It is thereby possible to prevent the foreign substances due to the existence of the resin member 60 from being attached onto the wafer back surface S2 in the handling of the semiconductor wafer 10.

Preferably, the resin member 60 is formed by deposition of its material, such as a coating method or the like. In this case, the resin member 60 does not need to have any adhesive agent. With no adhesive agent, first, it is possible to prevent any undesirable phenomenon caused by degassing from the adhesive agent in the processes in which a heat load is imposed in a vacuum. For example, in the ion implantation process, implantation failure can be prevented. Further, it is possible to suppress variation in the quality of film formation by evaporation, sputtering, or the like. Secondly, in the wet etching in the thinning processing, it is possible to avoid any reaction between the etchant such as the mixed acid or the like and the adhesive agent exposed at the end portion of the resin member. If such a reaction occurs, first, the end portion of the resin member is unintentionally peeled off and this is apt to cause the semiconductor wafer 10 to be broken or chipped. Secondly, also after removing the resin member, substances generated by the above-described reaction may be left on the semiconductor wafer 10. The residues can make a source for the foreign substances on the semiconductor wafer 10.

The Second Preferred Embodiment (Manufacturing Method)

Figure 10:
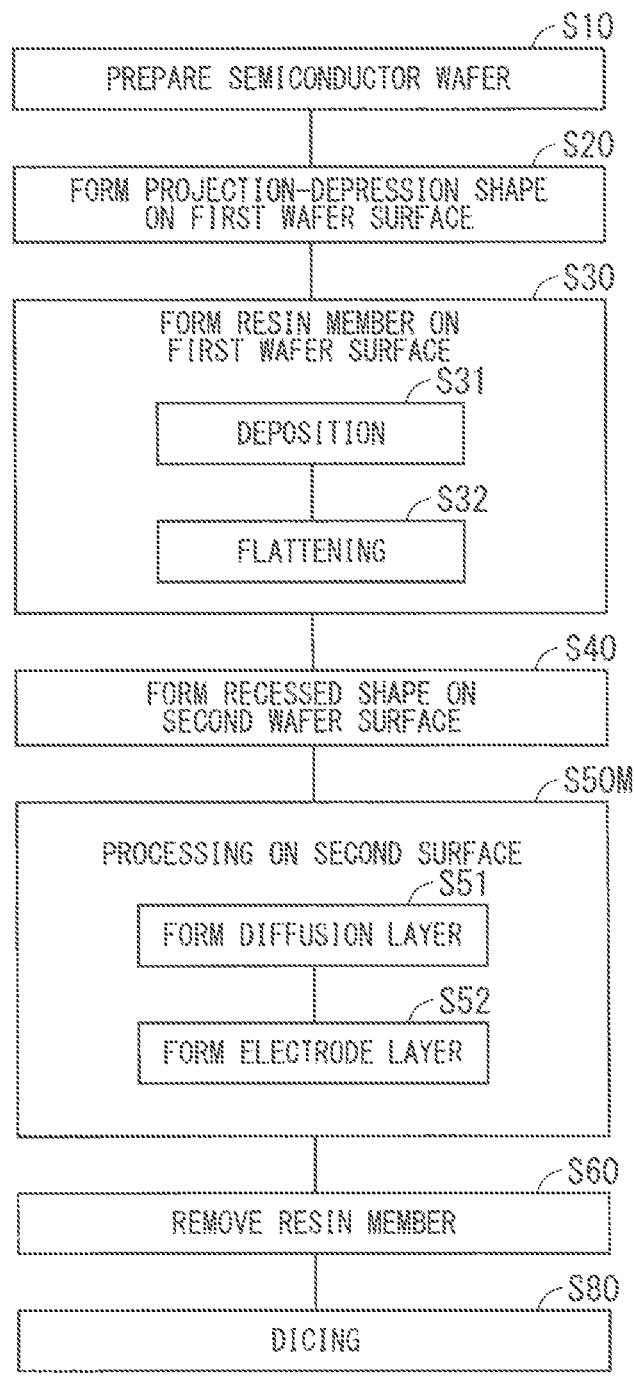
FIG. 10 is a flowchart schematically showing a flow of a method of manufacturing a semiconductor device in accordance with a second preferred embodiment of the present invention.

FIG. 10 is a flowchart schematically showing a flow of a method of manufacturing a semiconductor device in accordance with the second preferred embodiment. The process steps until Step S40 are the same as those in the first preferred embodiment (FIG. 2). In subsequent Step S50M, after the same Step S51 as that in the first preferred embodiment, Step S52 is executed. Step S52 is the same as Step S70 (FIG. 2) in the first preferred embodiment, in which the collector electrode 32 (FIG. 1) is formed as the electrode layer on the wafer back surface S2. In the second preferred embodiment, however, the step of forming the electrode layer is executed before Step S60 in which the resin member 60 (FIG. 3D) is removed. In other words, in the second preferred embodiment, the formation of the collector electrode 32 as the electrode layer is performed on the wafer back surface S2 before removing the resin member 60. Further, the process steps other than the above are almost the same as those in the first preferred embodiment described above.

(Example)

In this example, after forming the electrode layer on the wafer back surface S2, the resin member 60 on the wafer upper surface S1 was removed. Subsequently, the number of flaws and foreign substances each of which has a size of 5 μm or more on the wafer upper surface S1 was counted. On the other hand, in the Comparative Example, no resin member 60 was formed, and after forming the electrode layer, the same counting operation as above is performed. The formation of the electrode layer on the wafer back surface S2 was performed by using a film formation apparatus having a stage which fixes the semiconductor wafer 10 by absorbing the wafer upper surface S1. The result of the above counting operations is shown in the following table.

TABLE 1

|  | Wafer No. | The Number of Flaws or Foreign Substances |
|---|---|---|
| WITH RESIN MEMBER | #1 | 3 |
|  | #2 | 1 |
|  | #3 | 6 |
| NO RESIN MEMBER | #1 | 383 |
|  | #2 | 294 |
|  | #3 | 231 |

From this result, it can be seen that by forming the electrode layer on the wafer back surface S2 before removing the resin member 60, it is possible to reduce the number of flaws and foreign substances on the wafer upper surface S1.

(Summary of Effects) According to the second preferred embodiment, as a processing before removing the resin member 60, the electrode layer is formed on the wafer back surface S2. It is thereby possible to protect the wafer upper surface S1 by the resin member 60 when the electrode layer is formed on the wafer back surface S2. Specifically, it is possible to prevent the foreign substances from being attached onto the wafer upper surface S1 and prevent the wafer upper surface S1 from being damaged.

The Third Preferred Embodiment (Manufacturing Method)

Figure 11:
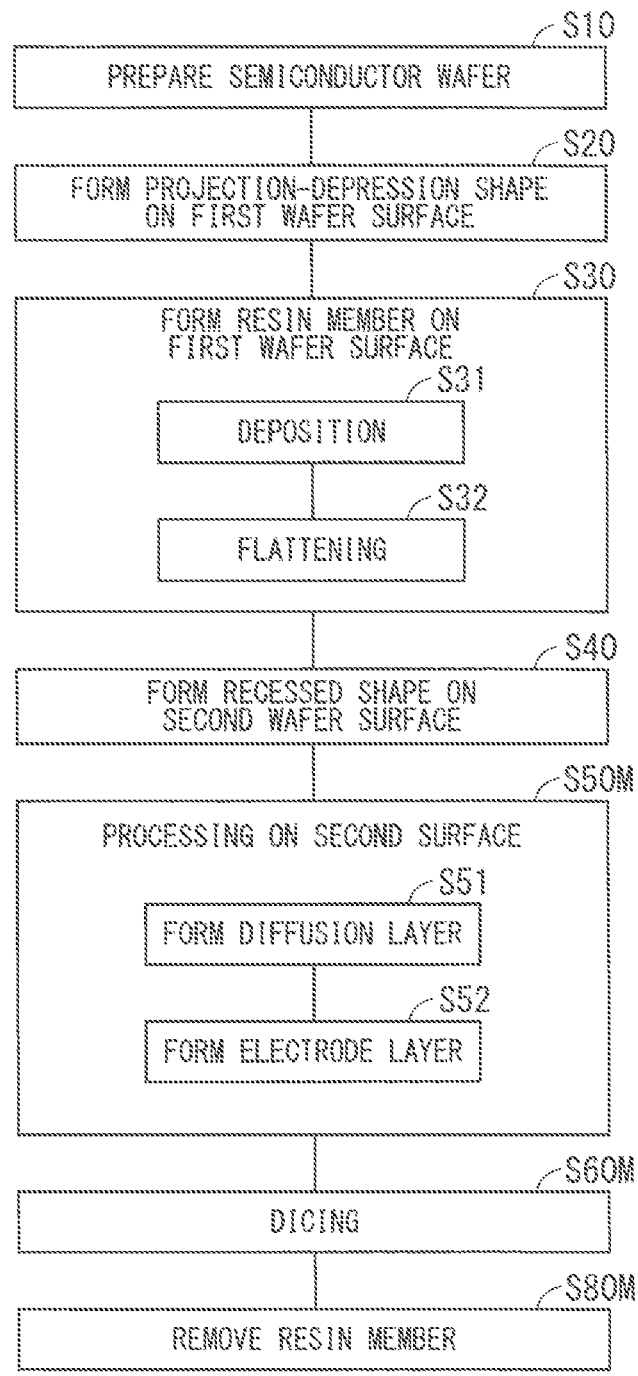
FIG. 11 is a flowchart schematically showing a flow of a method of manufacturing a semiconductor device in accordance with a third preferred embodiment of the present invention.

FIG. 11 is a flowchart schematically showing a flow of a method of manufacturing a semiconductor device in accordance with the third preferred embodiment. The process steps until Step S50M are the same as those in the second preferred embodiment (FIG. 10). After that, in Step S60M, dicing is performed, and subsequently in Step S80M, the resin member 60 (FIG. 3D) is removed. In other words, the dicing of the semiconductor wafer 10 is performed before removing the resin member 60. The removal of the resin member 60 can be performed, for example, by dissolving the resin with dropping of an organic solvent from above the dicing frame. Alternatively, an ashing process may be performed. Further, the process steps other than the above are almost the same as those in the second preferred embodiment described above.

(Example)

The process steps until the thinning processing (Step S40) were performed up to the thickness of 65 μm in the same method as that in the Example of the first preferred embodiment. In the Example, after performing dicing and removing the resin member 60 on the wafer upper surface S1, the number of foreign substances each of which has a size of 10 μm or more, such as scraps or the like caused by the dicing, on the wafer upper surface S1 (the upper surface of the chip) is counted. On the other hand, in the Comparative Example, no resin member 60 is formed, and after performing the dicing, the same counting operation as above is performed. The result of the above counting operations is shown in the following table.

TABLE 2

|  | Wafer No. | The Number of Foreign Substances |
|---|---|---|
| WITH RESIN MEMBER | #1 | 23 |
|  | #2 | 5 |
|  | #3 | 19 |
| NO RESIN MEMBER | #1 | 781 |
|  | #2 | 593 |
|  | #3 | 925 |

From this result, it can be seen that by performing the dicing before removing the resin member 60, it is possible to reduce the number of foreign substances on the wafer upper surface S1.

(Summary of Effects) According to the third preferred embodiment, as a processing before removing the resin member 60, the dicing of the semiconductor wafer 10 is performed. It is thereby possible to protect the wafer upper surface S1 by the resin member 60 when the dicing is performed. Specifically, it is possible to prevent the foreign substances from being attached onto the wafer upper surface S1.

Though the semiconductor device 50 (FIG. 1) has been described in detail in the above-described preferred embodiments, the semiconductor device may be any vertical power semiconductor device other than that shown in FIG. 1. Specifically, though FIG. 1 shows an n-channel type device, a p-channel type device may be formed by changing the conductivity type. Further, the semiconductor device is not limited to the IGBT but may be another type vertical semiconductor switching element. For example, the semiconductor device may be a MISFET (Metal Insulator Semiconductor Field Effect Transistor). The MISFET can be formed by, for example, omitting the p-type collector layer 6 in FIG. 1 and thereby forming the wafer back surface S2 only of the n-type layer 5. In this case, the emitter electrode 31 and the collector electrode 32 correspond to a source electrode and a drain electrode, respectively. Furthermore, though FIG. 1 shows the trench type one as a semiconductor device, the semiconductor device may be a planar type one having no trench. Further, the semiconductor device is not limited to the semiconductor switching element but may be, for example, a diode element.

In the present invention, the preferred embodiments may be freely combined, or may be changed or omitted as appropriate, without departing from the scope of the invention.

What is claimed is:

1. A method of manufacturing a semiconductor device, comprising the steps of:
   preparing a semiconductor wafer having a first wafer surface, a second wafer surface opposite to said first wafer surface, and a wafer outer peripheral end;
   forming at least a trench, an interlayer insulating film, emitter electrode, and electrode pad, the existence of said trench, interlayer insulating film, emitter electrode, and electrode pad forming a projection-depression shape on said first wafer surface of said semiconductor wafer;
   forming a resin member which has a resin outer peripheral end away from said wafer outer peripheral end and exposes said wafer outer peripheral end, on said first wafer surface of said semiconductor wafer, after forming said projection-depression shape;
   forming a recessed shape which has a recessed-portion outer peripheral end positioned 0.5 mm or more and 3.0 mm or less inside from said resin outer peripheral end, on said second wafer surface of said semiconductor wafer by partially removing said semiconductor wafer;
   performing a processing on said second wafer surface of said semiconductor wafer after forming said recessed shape; and
   removing said resin member after performing said processing.

2. The method of manufacturing a semiconductor device according to claim 1, wherein
   the step of forming said resin member includes the steps of:
   depositing said resin member on said first wafer surface; and
   flattening said resin member after depositing said resin member.

3. The method of manufacturing a semiconductor device according to claim 1, wherein
   the step of performing said processing includes the step of forming a diffusion layer on said second wafer surface.

4. The method of manufacturing a semiconductor device according to claim 1, wherein
   the step of performing said processing includes the step of forming an electrode layer on said second wafer surface.

5. The method of manufacturing a semiconductor device according to claim 1, further comprising the step of:
   dicing said semiconductor wafer before removing said resin member.

6. The method of manufacturing a semiconductor device according to claim 1, wherein
   said resin outer peripheral end is positioned 0.5 mm or more and 2.5 mm or less inside from said wafer outer peripheral end in said step of forming said resin member.

7. A method of manufacturing a semiconductor device, comprising the steps of:
   preparing a semiconductor wafer having a first wafer surface, a second wafer surface opposite to said first wafer surface, and a wafer outer peripheral end;
   forming a projection-depression shape on said first wafer surface of said semiconductor wafer;
   forming a resin member which has a resin outer peripheral end away from said wafer outer peripheral end and exposes said wafer outer peripheral end, on said first wafer surface of said semiconductor wafer, after forming said projection-depression shape;

forming a recessed shape which has a recessed-portion outer peripheral end positioned 0.5 mm or more and 3.0 mm or less inside from said resin outer peripheral end, on said second wafer surface of said semiconductor wafer by partially removing said semiconductor wafer;

performing a processing on said second wafer surface of said semiconductor wafer after forming said recessed shape; and removing said resin member after performing said processing, wherein the step of performing said processing includes the step of forming a diffusion layer on said second wafer surface.

8. A method of manufacturing a semiconductor device, comprising the steps of:

preparing a semiconductor wafer having a first wafer surface, a second wafer surface opposite to said first wafer surface, and a wafer outer peripheral end;

forming a projection-depression shape on said first wafer surface of said semiconductor wafer;

forming a resin member which has a resin outer peripheral end away from said wafer outer peripheral end and exposes said wafer outer peripheral end, on said first wafer surface of said semiconductor wafer, after forming said projection-depression shape;

forming a recessed shape which has a recessed-portion outer peripheral end positioned 0.5 mm or more and 3.0 mm or less inside from said resin outer peripheral end, on said second wafer surface of said semiconductor wafer by partially removing said semiconductor wafer;

performing a processing on said second wafer surface of said semiconductor wafer after forming said recessed shape; and removing said resin member after performing said processing, wherein the step of performing said processing includes the step of forming an electrode layer on said second wafer surface.

* * * * *